US012735786B2

(12) United States Patent
Schiftner et al.

(10) Patent No.: US 12,735,786 B2
(45) Date of Patent: Sep. 15, 2026

(54) TITANIUM DIBORIDE COATED REFRACTORY METAL COMPONENT

(71) Applicant: PLANSEE SE, Reutte (AT)

(72) Inventors: Robert Schiftner, Reutte (AT); Katrin Knittl, Reutte (AT); Thomas Huber, Reutte (AT); Michael Mark, Reutte (AT)

(73) Assignee: Plansee SE, Reutte (AT)

( * ) Notice: Subject to any disclaimer, the term of this patent is extended or adjusted under 35 U.S.C. 154(b) by 268 days.

(21) Appl. No.: 18/257,645

(22) PCT Filed: Nov. 25, 2021

(86) PCT No.: PCT/AT2021/060446
§ 371 (c)(1),
(2) Date: Jun. 15, 2023

(87) PCT Pub. No.: WO2022/126157
PCT Pub. Date: Jun. 23, 2022

(65) Prior Publication Data

US 2024/0117488 A1 Apr. 11, 2024

(30) Foreign Application Priority Data

Dec. 15, 2020 (AT) ............................ GM50250/2020

(51) Int. Cl.

| | |
|---|---|
| ***C23C 16/38*** | (2006.01) |
| ***C22C 27/00*** | (2006.01) |
| ***C23C 16/04*** | (2006.01) |
| ***F16B 23/00*** | (2006.01) |
| ***F16B 25/00*** | (2006.01) |
| ***F16B 31/00*** | (2006.01) |
| ***F16B 33/00*** | (2006.01) |
| ***F16B 35/00*** | (2006.01) |
| ***F16B 37/00*** | (2006.01) |

(52) U.S. Cl.
CPC .............. *C23C 16/38* (2013.01); *C22C 27/00* (2013.01); *C23C 16/04* (2013.01); *F16B 23/00* (2013.01); *F16B 25/00* (2013.01); *F16B 31/00* (2013.01); *F16B 33/00* (2013.01); *F16B 35/00* (2013.01); *F16B 37/00* (2013.01)

(58) Field of Classification Search
None
See application file for complete search history.

(56) References Cited

U.S. PATENT DOCUMENTS

| | | | | |
|---|---|---|---|---|
| 3,431,141 | A * | 3/1969 | Eorgan | C01B 35/04 428/564 |
| 4,692,385 | A * | 9/1987 | Johnson | C23C 28/00 428/472 |
| 4,975,621 | A * | 12/1990 | Fukubayashi | H01J 35/105 313/355 |
| 8,388,709 | B2 | 3/2013 | Wallgram et al. | |
| 2003/0039867 | A1 | 2/2003 | Berger et al. | |
| 2005/0260433 | A1* | 11/2005 | Sakashita | C22C 14/00 428/629 |
| 2010/0322817 | A1* | 12/2010 | Sakashita | G21F 5/00 420/420 |
| 2013/0004261 | A1 | 1/2013 | Pattinson et al. | |
| 2019/0136371 | A1 | 5/2019 | Bischof | |

FOREIGN PATENT DOCUMENTS

| | | | | |
|---|---|---|---|---|
| CN | 108893712 A | | 11/2018 | |
| CN | 109930108 A | | 6/2019 | |
| CN | 112072118 A | * | 12/2020 | H01M 4/661 |
| DE | 102013213503 A1 | | 8/2014 | |
| FR | 1601469 | * | 10/1970 | C23C 16/38 |
| GB | 851208 A | | 10/1960 | |
| GB | 2171039 A | | 4/1990 | |
| JP | H04301067 A | | 10/1992 | |
| JP | 2007262498 A | | 10/2007 | |
| KR | 20210097308 A | | 8/2021 | |
| WO | 2009070820 A1 | | 6/2009 | |

OTHER PUBLICATIONS

Total Materia, "Welding of Reactive and Refractory Metals", Jul. 2002, <https://www.totalmateria.com/en-us/articles/welding-of-reactive-and-refractory-metals/> (Year: 2002).*

Stanford Advanced Materials, "MU0088 Molybdenum Fastener (Mo Fastener)", <https://www.samaterials.com/machined-molybdenum/88-molybdenum-fasteners.html>, Jan. 3, 2019, accessed via web.archive.org (Year: 2019).*

China Tungsten, "TZM High Temperature Fasteners", <http://www.molybdenum-alloy.com/tzm-alloy-high-temperature-fasteners.html>, Jul. 12, 2019, accessed via web.archive.org (Year: 2019).*

Huang Xiaoxiao et al: Investigation of mechanical properties and oxidation resistance of CVD TiB2 ceramic coating on molybdenum, Journal of Materials Research and Technology, Bd. 9, Nr. 1, Jan. 1, 2020, XP055888101.

Lin et al., Machinery manufacturing technology, Aug. 2008, p. 115, Huazhong University of Science and Technology Press, Wuhan, China.

* cited by examiner

*Primary Examiner* — Xiaobei Wang

(74) *Attorney, Agent, or Firm* — Laurence A. Greenberg; Werner H. Stemer; Ralph E. Locher

(57) ABSTRACT

A component formed of a refractory metal has a surface that is at least partially coated with a layer of titanium diboride. There is also described a method of manufacturing the component and the application of $TiB_2$ as a release agent in high-temperature applications.

6 Claims, No Drawings

TITANIUM DIBORIDE COATED REFRACTORY METAL COMPONENT

FIELD AND BACKGROUND OF THE INVENTION

The present invention relates to a component consisting of a refractory metal, characterized in that the surface of the component is at least partially coated with a layer of $TiB_2$, the manufacture of the component and the use of $TiB_2$ as a release agent in high temperature applications.

In high-temperature plants, such as sintering furnaces, heat treatment plants and quartz melting plants or also in lighting plants and evaporation plants, parts and components are used which must be detachable even after repeated exposure to temperature and stress. The detachability of such components after exposure to high temperatures in the range of 1000° C. to 1800° C. presents a particular challenge, since the typically metal-fabricated components tend to sinter at their contact surface with the mating contact surface, the phenomenon of seizing. If the contact surfaces are additionally subjected to pressure, as in the case of a screw connection, for example, the metallurgical bonding of the contact surface pairs is further promoted. Thereafter, the contact surface pairs can no longer be separated from each other without causing damage, and the separation leads to the destruction of at least one component.

To avoid this problem, the prior art employs different material combinations or the use of auxiliary and separating agents, such as sleeves or applied separating layers of pastes. However, these methods quickly reach their limits under extreme conditions. For example, some auxiliaries and release agents cannot be used in a vacuum due to the risk of evaporation of their components and/or their operating temperature is limited due to the risk of decomposition or cross-contamination. Currently, $Al_2O_3$, $ZrO_2$ or boron nitride sprays or powders are used for the application in furnace construction. However, these variants are unsuitable for applications with temperatures above 1400° C., since in particular cross-contamination between components and the auxiliary and release agent is a problem.

In the production of coarse-grained, creep-resistant molybdenum charging sheets, recrystallization annealing at temperatures above 1700° C. is necessary, whereby sheets partially sinter in the stack and are therefore no longer separable after the annealing run. Up to now, tungsten thin sheet has been used as a separation aid. However, the disadvantage of this process is that the tungsten thin sheets can only be used once and thus contribute significantly to the high production costs of charging sheets.

DE 102013213503 relates to a threaded connection for vacuum applications comprising a screw with external threads and a component with internal nut threads, wherein either the component or the screw or both are formed from a stainless austenitic steel, wherein different pairs of contact surfaces are created by coating the component/screw with coating materials different from the base materials, allowing mutual sliding without lubricants harmful to vacuum.

In GB201110939, there is provided a first member suitable for selectively engaging a second member, the first member comprising a coating and at least an engaging portion of the first member being coated in the coating, the coating being formed by vapor deposition to provide a thermochemically stable layer for temperatures up to 800° C. The coating may comprise one or more nitrides, oxides, or carbides of titanium, chromium, or aluminum. For example, the coating may comprise one or more of titanium nitride, chromium nitride, aluminum nitride, titanium oxide, chromium oxide, aluminum oxide, titanium carbide, chromium carbide, or aluminum carbide.

In the field of high-temperature treatments, the use of particularly high temperatures of over 1800° C. is increasingly required. At the same time, increasingly stringent requirements are laid down on the purity of the treated products.

SUMMARY OF THE INVENTION

Accordingly, the object of the present invention is to provide a coated component which is detachable even after use at temperatures in the range of 1400° C. to 1800° C., wherein no decomposition or cross-contamination with other components or treated products occurs.

This object is solved by providing a component as claimed consisting of a refractory metal, the surface of which is at least partially coated with a layer of $TiB_2$. Advantageous embodiments of the invention are the subject of the dependent claims, which can be freely combined with one another.

The coating with a $TiB_2$ layer enables the components to be used in various atmospheres, such as hydrogen or in a vacuum, without having to expect evaporation, cross-contamination or decomposition. The layer also ensures the non-destructive replacement and non-destructive opening of components, respectively. Sintering of component parts can thus be prevented and it can hence be ensured that they remain detachable. By coating with $TiB_2$, it has been possible to cover the widest temperature application range to date, from 400° C. up to 1800° C., without any risk of contamination/pollution or seizure, and to achieve detachability of the components/machine elements.

According to the present invention, a connection is detachable if surfaces of components that are in direct contact with each other can be separated from each other again without damaging the components, and it is not detachable if the components have to be at least partially destroyed in order to separate the contacting surfaces from each other again.

The coated component according to the invention is particularly suitable for high-temperature applications, i.e., for temperatures from 400° C. to 2000° C., presently in particular 1400° C. to 1800° C.

To withstand these temperatures, the component of the present invention consists of a refractory metal.

In the context of the present invention, a refractory metal is understood to be a metal selected from the group consisting of titanium, zirconium, hafnium, vanadium, niobium, tantalum, chromium, molybdenum, tungsten and rhenium and alloys of said metals, also referred to herein as refractory metal alloys. Refractory metal alloys are alloys with at least 50 at. % of one or more of the above-mentioned metals, preferably with at least 70 at. %, further preferred with at least 90 at. % and even more preferably with at least 95 at. %.

It is understood that the melting point of the refractory metal defined above is selected so that the component is suitable for the temperature that is targeted in use. Preferably, the refractory metal has a melting point greater than 1400° C., more preferably greater than 1800° C., and more preferably greater than 2000° C.

In one embodiment, the component consists of molybdenum, besides unavoidable impurities, or a molybdenum alloy.

In one embodiment, it is further preferred that the alloy comprises, in addition to molybdenum, up to 30% by weight of further of the above-mentioned refractory metal elements.

In a further embodiment, it is preferred that compositions consist, in addition to molybdenum, of the following percentages of elements by weight:

0.5 wt % Ti and 0.08 wt % Zr and 0.01 wt % to 0.04 wt % C. 1.2 wt % Hf and 0.01 wt % to 0.04 wt % C. 0.3 wt % $La_2O_3$. 0.7 wt. % $La_2O_3$. 0.47 wt. % $Y_2O_3$ and 0.08 $Ce_2O_3$. 0.005 to 0.1 wt. % K and 0.005 wt. % to 0.1 wt. % Si and 0.01 to 0.2 wt. % 0.5 wt. % Re or 41 wt. % Re. 30 wt. % W. Furthermore, compositions are also included in which the proportions given here differ by up to 10%.

The proportions given and the data refer to the element referred to in each case (e.g. Mo, C or W), irrespective of whether it is present in the molybdenum base material in elemental or bound form. The proportions of the different elements are determined by chemical analysis.

The term component in the sense of the present invention includes individual parts (machine elements, components), in particular construction means which are suitable for the exchange or reversible fastening and loosening of machine elements, as well as assemblies composed of individual parts. Suitable individual parts are in particular screws, nuts, pins, locating pins, washers, bolts, sheets, clips, tubes, rods and U-rails. The term assemblies includes, in particular, welded and riveted components, such as gas inlet tubes, heater suspensions, and charging racks. The term components as used in the present invention specifically excludes cutting parts of cutting tools.

Preferred components as production aids are contact parts, such as separator sheets and washers.

Particularly preferred components as production aids are components having a thread, such as a screw or a nut. A screw is particularly preferred.

According to the invention, the layer of the component consists of $TiB_2$. The $TiB_2$ layer is typically formed by chemical vapor deposition (CVD) using $H_2$, $N_2$ $TiCl_4$ and $BCl_3$. Typically, the layer is deposited on the component at a temperature in the range of 800° C. to 900° C. over a period of 5 to 9 h, preferably at 850° C. over a period of 7 h. It is also possible to produce the coating by means of physical vapor deposition (PVD).

Correspondingly coated components have a $TiB_2$ layer with a thickness in a range from 1 μm to 5 μm, preferably 1.5 μm to 4 μm, further preferably 2 μm to 3.5 μm and even more preferably 2.6 μm to 3.1 μm. The thickness of the coating can be determined by lateral SEM measurement of a transverse section of the coated component. The component typically has no other layers of other materials. If necessary, an adhesion promoter layer, preferably consisting of TiN with a thickness in the range of 0.5 μm to 1.8 μm may be present between the substrate and the $TiB_2$ layer. The $TiB_2$ layer is the outermost layer of the coated component.

Typically, the layer is completely deposited on the coated component's surface which is to be contacted with further components. In order to achieve the detachability of the components, it is already sufficient if the layer is only partially applied to the coated component's surface which is to be contacted with further components.

Preferably, 20 to 100% of the coated component's surface which to be contacted with a further component is coated with the layer, further preferably 50 to 100%. The present invention can be used wherever good releasability of a component from another component is required after the component has been used in high temperature applications. Accordingly, the use of titanium diboride as a release agent to improve the releasability of components in high temperature applications is also subject-matter of the present invention. Preferably, the titanium diboride is used in the form of a layer applied by CVD or PVD, preferably on a component consisting of a refractory metal.

Further advantages of the invention will be apparent from the following description of examples of embodiments.

EXAMPLES

TZM plate (molybdenum with weight fraction of 0.5 Ti and 0.08 Zr and 0.01 to 0.04 C) 140×80×9 mm, 9 mm deep through bore M6 thread milled.

Molybdenum washer: 18×6, 4×1.5 mm

Molybdenum screw: M6×12 mm

Comparison example 1 (C1): Molybdenum screws (rolled) without coating.

Comparison example 2 (C2): Several molybdenum screws (rolled) with a TiN CVD coating were fabricated using $H_2$, $N_2$ and $TiCl_4$ at a temperature of 850° C. for 7 h. The TiN coatings were deposited on the surface of the screws. The thickness of the TiN coatings was 2.6 μm to 3.1 μm.

Example (E) according to the invention: several molybdenum screws (rolled) with a $TiB_2$ CVD coating were prepared using $H_2$, $N_2$, $TiCl_4$, and $BCl_3$ at a temperature of 850° C. for 7 h. The thickness of the $TiB_2$ coatings ranged from 2.6 μm to 3.1 μm.

As indicated in the table below, several tests were conducted to evaluate the $TiB_2$ layer compared with the TiN layer and the uncoated component under different conditions. For this purpose, three screws (S1 to S3) with washers were selected in each case and screwed into the plate at a tightening torque of 12 Nm. High temperature treatments were performed at temperatures (T in ° C.) from 400° C. to 1800° C. and different atmospheres (A) (hydrogen (H), vacuum $10^{-6}$ mbar (V)) for different holding times (H). The opening torque (L in Nm) after the high temperature treatment was measured and the threads were visually inspected for seizing (S) and, if applicable, breakage (B) of the screw was detected.

| | | | | S1 | | | S2 | | | S3 | | | total | |
|---|---|---|---|---|---|---|---|---|---|---|---|---|---|---|
| Ex. | T | H | A | L | S | B | L | S | B | L | S | B | S | B |
| E1 | 400 | 2 | V | 5 | no | no | 5 | no | no | 5 | no | no | no | no |
| | 1000 | 2 | V | 5 | no | no | 5 | no | no | 5 | no | no | no | no |
| | 1400 | 2 | V | 5 | no | no | 5 | no | no | 5 | no | no | no | no |
| | 1400 | 168 | V | 10 | no | no | 10 | no | no | 10 | no | no | no | no |
| | 1800 | 2 | V | 15 | no | no | 15 | no | no | 15 | no | no | no | no |
| | 1400 | 2 | H | 5 | no | no | 5 | no | no | 5 | no | no | no | no |
| | 1800 | 2 | H | 15 | no | no | 15 | no | no | 12 | no | no | no | no |

-continued

| | | | | S1 | | | S2 | | | S3 | | | total | |
|---|---|---|---|---|---|---|---|---|---|---|---|---|---|---|
| Ex. | T | H | A | L | S | B | L | S | B | L | S | B | S | B |
| C1 | 400 | 2 | V | 15 | no | no | 20 | yes | no | 15 | yes | no | partly | no |
| | 1000 | 2 | V | 15 | yes | no | 12 | yes | no | 12 | yes | no | yes | no |
| | 1400 | 2 | V | 15 | yes | no | 15 | yes | ja | 15 | yes | yes | yes | partly |
| | 1400 | 2 | H | 12 | yes | yes | 12 | yes | no | 12 | yes | no | yes | partly |
| C2 | 1400 | 2 | V | 5 | no | no | 10 | yes | no | 5 | yes | no | partly | no |
| | 1400 | 168 | V | 12 | yes | no | 12 | yes | no | 15 | no | no | partly | no |
| | 1800 | 2 | V | 10 | yes | no | 10 | yes | no | 10 | yes | no | yes | no |
| | 1400 | 2 | H | 10 | yes | no | 5 | no | no | 10 | no | no | partly | no |
| | 1800 | 2 | H | 12 | yes | no | 12 | yes | no | 10 | yes | no | yes | no |

As can be seen from the above table, the uncoated components, in this case the plate and screw, show seizing already at low temperatures from 400° C. and are therefore unsuitable for high-temperature applications.

The TiN-coated screws show partial seizing of the components at 1400° C. in hydrogen atmosphere and in vacuum, also in long-term tests, and seizing of all components at 1800° C. in all atmospheres.

In contrast, the TiB2 coating according to the invention does not cause any seizing of the screw connection. Consequently, the coating can achieve the detachability of contacting refractory metal components even in long-term high-temperature applications. Cross-contamination between the components was not observed.

The invention claimed is:

1. A component for high-temperature applications, the component consisting of a metal selected from the group consisting of zirconium, hafnium, vanadium, niobium, tantalum, chromium, molybdenum, tungsten, rhenium, and an alloy of said metals; and the component being a threaded component formed with a thread, and the thread having a layer of titanium diboride deposited directly on said metal of the component or deposited directly on an adhesion promoter layer with a thickness of 0.5 um to 1.8 um, which is deposited directly on said metal of the component, said layer of titanium diboride forming an outermost layer of the coated component and being configured to enable the component to be nondestructively released from a threaded connection after extended use at a high temperature between 1400° C. and 1800° C.

2. The component according to claim 1, wherein said alloy comprises at least 70% by weight of molybdenum.

3. The component according to claim 1, wherein the layer of titanium diboride has a layer thickness in a range from 1 μm to 5 μm.

4. The component according to claim 1, wherein the component is completely coated.

5. The component according to claim 1, wherein said layer is a titanium diboride layer deposited by chemical vapor deposition.

6. A method of manufacturing a coated component, the method comprising the following steps:

providing a component consisting of a metal selected from the group consisting of zirconium, hafnium, vanadium, niobium, tantalum, chromium, molybdenum, tungsten, rhenium, and an alloy of said metals;

the component being a threaded component formed with a thread; and depositing, by chemical vapor deposition or by physical vapor deposition, a layer of titanium diboride directly on the thread of the component or directly on an adhesion promoter layer of titanium nitride which has a thickness of 0.5 to 1.8 μm and which is deposited directly on the thread of the component, to form the threaded component with the layer of titanium diboride as an outermost layer that is suitable for use at high temperatures above 1400° C. without seizing between the threaded component and a further component.

* * * * *